United States Patent

[11] 3,593,196

[72] Inventor George I. Haddad
Ann Arbor, Mich.
[21] Appl No 800,532
[22] Filed Feb. 19, 1969
[45] Patented July 13, 1971
[73] Assignee Omni Spectra, Inc.
Farmington, Mich.

[54] TYPE OF AVALANCHE DIODE
4 Claims, 5 Drawing Figs.

[52] U.S. Cl. 331/107 R, 317/235 T, 317/235 K
[51] Int. Cl. H03b 7/06
[50] Field of Search 331/107, 117 D; 307/318; 317/235, 25, 43

[56] References Cited

UNITED STATES PATENTS

| | | | |
|---|---|---|---|
| 2,899,646 | 8/1959 | Read, Jr. | 317/235 |
| 2,997,604 | 8/1961 | Shockley | 317/235 |
| 3,270,293 | 8/1966 | DeLoach, Jr. et al | 331/107 |
| 3,356,866 | 12/1967 | Misawa | 331/117 |
| 3,426,295 | 2/1969 | De Loach, Jr. et al | 331/107 |
| 3,470,036 | 9/1969 | Svedberg | 317/235 |

*Primary Examiner*—John Kominski
*Attorney*—Harness, Dickey and Pierce

ABSTRACT: An avalanche diode, of the IMPATT diode type, which may be used as an oscillator, amplifier, or frequency converter and having a construction utilizing both $N^+P$ and $NP^+$ junctions whereby improved power output and other operating characteristics can be attained.

INVENTOR.
George I. Haddad
BY
Harness, Dickey & Pierce
ATTORNEYS.

TYPE OF AVALANCHE DIODE

SUMMARY BACKGROUND OF THE INVENTION

Heretofore in an IMPATT diode construction a semiconductor device has been utilized which includes a relatively weakly doped intermediate region which has highly doped end regions of opposite conductivity such as the $N^+PIP^+$ structure shown in the U.S. Pat. No. 2,899,646, to W. T. Read, issued Aug. 11, 1959. These prior IMPATT devices, however, have been found to have power limitations such that (at a given frequency) the power output reaches a maximum and then decreases as the magnitude of DC current increases. It is believed that this is due to space-charge effects in the drift region. In the present invention, these space-charge effects are minimized resulting in an IMPATT diode having an improved power output capability. This is accomplished by providing an IMPATT device with $N^+P$ and $NP^+$ junctions at opposite end regions.

Therefore, it is an object of the present invention to provide a new IMPATT diode construction.

It is another object to provide a new IMPATT diode construction having improved power output capabilities.

It is still another object to provide an IMPATT diode utilizing $N^+P$ and $NP^+$ junctions at opposite ends.

Other objects, features, and advantages of the present invention will become apparent from the subsequent description and the appended claims, taken in conjunction with the accompanying drawings, in which:

Figure 1:
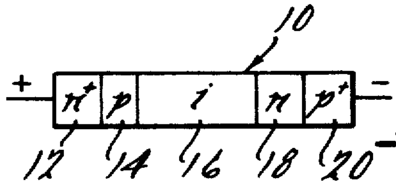
FIG. 1 shows one form of diode embodying features of the present invention.
Figure 1A:
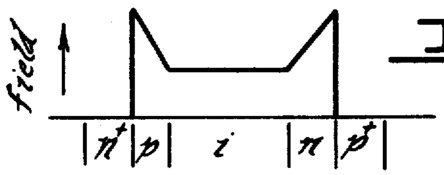
FIG. 1A depicts the electric field distribution for the diode of FIG. 1.
Figure 2:
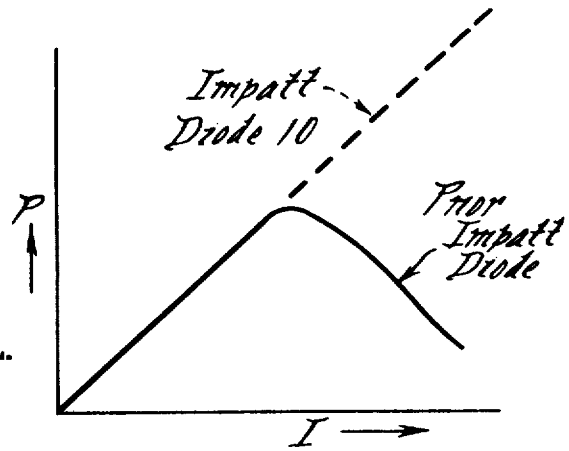
FIG. 2 is a graph of Power v. Current comparing prior IMPATT diode constructions with the construction of the present invention.

Looking now to the drawing, a semiconductor device 10 of the present invention is shown in FIG. 1 and includes at one end a heavily doped N-region 12 ($N^+$) adjacent to a P-region 14 which together define an $N^{115}$ P junction. At the opposite end is located an $NP^+$junction defined by an N-region 18 and a heavily doped P-region ($P^+$) 20. An intermediate, weakly doped region 16 (I) is located intermediate the two junctions $N^+P$ and $NP^+$. With prior IMPATT diodes, a field distribution having a maximum intensity at the $N^+P$ junction occurs (see patent to Read, FIG. 3). It is believed that a high current intensities a space-charge effect occurs because only one type of carrier, i.e. holes, drifts through the drift region which is the region following the $N^+P$ junction. In the present invention with the provision of the $NP^+$ junction (regions 18 and 20) at the opposite end, a field distribution as shown in FIG. 1A will be provided. With such a construction, avalanche will occur at both the $N^+$ P and $PN^+$ junctions; the $N^+P$ junctions; the $N^+P$ junction (regions 12 and 14) will inject holes into the drift region, i.e. generally region 16(I), and the $NP^+$ junction (regions 18 and 20) will inject electrons into the drift region. Since holes and electrons have charges of opposite polarity, the result is that space-charge effects are minimized. FIG. 2 depicts the difference in power capability between the prior IMPATT diode construction and one constructed in accordance with the present invention. Note the power limitations with increased current of the former and the improved characteristic of the latter. Of course, the latter will eventually be limited by inherent physical limitations, i.e. heat loss, etc.

The diode 10 will have a frequency of oscillation $f=1/2T$ which can be selectively varied by varying the time $T$ which is required for the generated holes to drift across the intrinsic region 16 (I). The diode 10 will provide oscillation at frequencies in the microwave range and higher, i.e. 100 MHz and higher.

Figure 3:
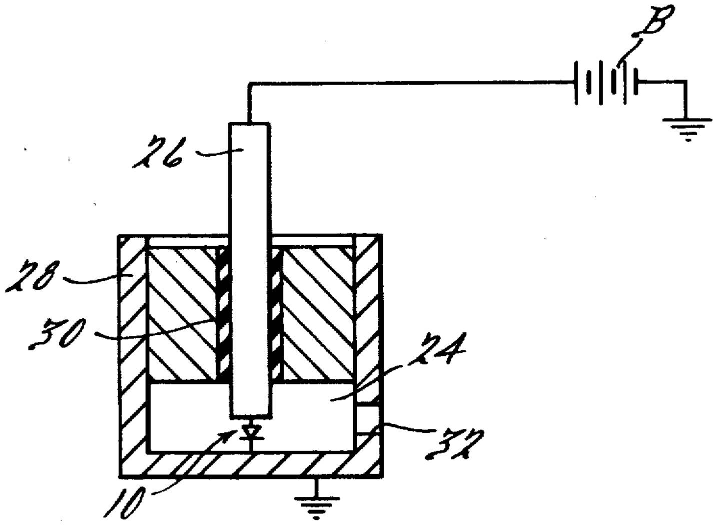
FIG. 3 is a sectional view depicting the diode of the present invention in assembly relation in a microwave oscillator circuit.

Looking to FIG. 3, the diode 10 is shown in assembly relation with a resonant cavity which includes a tunable cavity 24 with the diode 10 having its negative side (region 20) grounded thereto and having its positive side (region 12) connected to a conductor member 26. A movable short 28 is slidably mounted within cavity 24 in engagement with the sidewalls and is insulated from member 26 by a bushing 30. The frequency of the signal in the cavity 24 can be varied by varying the position of movable short 28. A battery B has its negative terminal connected to member 26 and has its positive side connected to ground. A window 32 is provided whereby the generated microwave energy in cavity 24 can be coupled to a load.

Figure 4:
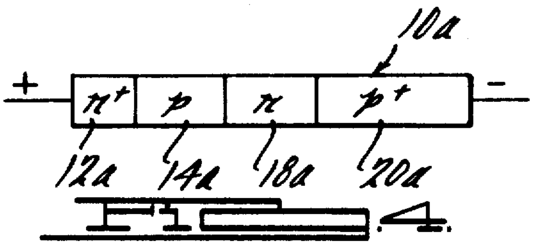
FIG. 4 depicts a modified form of IMPATT diode embodying features of the present invention.

The intrinsic region 16 (I) of diode 10 can be omitted and a diode 10*a* having the power output characteristic of diode 10 can be provided. In the embodiment of FIG. 4, the diode 10*a* as depicted includes an $N^+$region 12*a* adjacent a P-region 14*a* and an N-region 18*a* adjacent to a $P^+$region 20*a* with the defined $N^+P$ junction being immediately adjacent the defined $NP^+$region. The diode 10*a* also minimizes space-charge affects and has an improved power output versus current characteristic similar to that shown in FIG. 2.

While it will be apparent that the preferred embodiments of the invention disclosed are well calculated to fulfill the objects above stated, it will be appreciated that the invention is susceptible to modification, variation and change without departing from the proper scope or fair meaning of the invention. For example, multifrequency operation can be achieved in this device by incorporating it in appropriate resonant circuits.

What I claim is:

1. A microwave generator comprising:
an IMPATT diode having a heavily doped N-region at one end with inwardly adjacent P-region which together comprise an $N^+P$ junction at the one end and a heavily doped P-region at an opposite end with an inwardly adjacent N-region which together comprise an $NP^+$ junction at the opposite end; and
oscillator circuit means connected to the ends of said diode to apply a positive potential to said one end and a negative potential to said opposite end for operating said diode in the avalanche region of both said $N^+P$ junction and $NP^+$ to provide an oscillating output with a frequency generally in the microwave range whereby said $N^+P$ junction injects holes between said junctions and said $NP^+$ junction injects electrons between said junctions which minimize the space charge effects of said holes injected by said $N^+P$ junction so as to improve the microwave power output capability of said generator.

2. The diode of claim 6 with said $N^+P$ junction and said $NP^+$ junction being connected with an intrinsic region.

3. The diode of claim 6 with said $N^+P$ junction and said $NP^+$ junction being connected with substantially no intrinsic region.

4. In combination with the diode of claim 6 apparatus including means connecting the $N^+$ region of said $N^+P$ junction to the positive side of a source of potential and the $P^+$ region of said $NP^+$ junction the negative side of the source of potential.

UNITED STATES PATENT OFFICE
CERTIFICATE OF CORRECTION

Patent No. 3,593,196 Dated July 13, 1971

Inventor(x) George I. Haddad

It is certified that error appears in the above-identified patent and that said Letters Patent are hereby corrected as shown below:

Col. 1, line 46, "$N^{115}$ P" should be -- $n^{+}$-p --.
Col. 1, line 59, after "junctions;" (first occurrence), delete "the $N^{+}P$ junctions;".
Claim 2, line 58, "6" should be --1--.
Claim 3, line 60, "6" should be --1--.
Claim 4, line 63, "6" should be --1--.

Signed and sealed this 21st day of March 1972.

(SEAL)
Attest:

EDWARD M.FLETCHER,JR.
Attesting Officer

ROBERT GOTTSCHALK
Commissioner of Patents